(12) United States Patent
Lee et al.

(10) Patent No.: US 6,754,080 B2
(45) Date of Patent: Jun. 22, 2004

(54) CLIP FOR HEAT SINK

(75) Inventors: Hsieh Kun Lee, Tu-chen (TW); WanLin Xia, Shenzhen (CN); Gencai Wang, Shenzhen (CN); Tao Li, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/310,290

(22) Filed: Dec. 4, 2002

(65) Prior Publication Data

US 2004/0052053 A1 Mar. 18, 2004

(30) Foreign Application Priority Data

Sep. 13, 2002 (TW) ...................................... 91214414 U

(51) Int. Cl.$^7$ ............................. H05K 7/12; H05K 7/10; H05K 7/20
(52) U.S. Cl. ...................... 361/710; 361/709; 361/704; 257/719; 24/458
(58) Field of Search .......................... 24/297, 453, 457, 24/458, 625; 267/150, 158, 160; 248/505, 510; 174/16.3; 257/718, 719, 722, 726, 727; 165/80.3, 185; 439/485, 487; 361/703, 704, 705, 709–712, 717–719

(56) References Cited

U.S. PATENT DOCUMENTS

| | | | | |
|---|---|---|---|---|
| 5,979,025 A | * | 11/1999 | Horng | ........................ 24/459 |
| 6,111,752 A | * | 8/2000 | Huang et al. | ................ 361/704 |
| 6,226,186 B1 | * | 5/2001 | Chien | .......................... 361/704 |
| 6,272,722 B1 | * | 8/2001 | Lai | .............................. 24/458 |
| 6,301,112 B1 | * | 10/2001 | Lee | |
| 6,310,774 B1 | * | 10/2001 | Lee | .............................. 361/704 |
| 6,362,963 B1 | * | 3/2002 | Lee et al. | .................... 361/704 |
| 6,430,049 B1 | * | 8/2002 | Lai et al. | |
| 6,456,493 B1 | * | 9/2002 | Lee | .............................. 361/704 |

OTHER PUBLICATIONS

USPGPUB 2002/0036891 A1, Dec. 4, 2000, Lo.*

* cited by examiner

Primary Examiner—Anatoly Vortman
(74) Attorney, Agent, or Firm—Wei Te Chung

(57) ABSTRACT

A clip (10) for securing a heat sink (20) to an electronic chip (40) mounted on a socket (30) includes a substantially V-shaped body (11), first and a second legs (14,15) depending from respective opposite ends of the body, and a handle (17) formed at the second leg for facilitating manual operation. The body has a horizontal pressing section (12). Each leg defines a first opening (16) for engagingly receiving a respective projection (32) of the socket. The handle is integrally formed by cutting and bending material from the body and the second leg, and comprises a generally V-shaped body (171) and an operating section (172). The operating section projects out from second leg. Pressing the handle enables the second leg to be resiliently engaged with the corresponding projection of the socket.

14 Claims, 2 Drawing Sheets

CLIP FOR HEAT SINK

BACKGROUND OF THE INVENTION

1. Field of the Invention

The present invention relates to clips, and particularly to a clip which readily and firmly secures a heat sink to an electronic device.

2. Related Art

Computer electronic devices such as central processing units (CPUs) frequently generate large amounts of heat. Oftentimes, a heat sink is attached onto a top surface of a CPU by using any of a variety of currently available clips. By removing heat from the CPU, the heat sink protects the CPU and associated components from instability and damage.

A conventional clip for a heat sink is disclosed in Taiwan Patent No. 313,278. The clip includes four parts, and is therefore unduly difficult to assemble. This unnecessarily inflates costs, particularly in mass-production facilities. U.S. Pat. No. 6,301,112 discloses a single-piece clip attaching a heat sink to an electronic device. However, the assembly, disassembly and reassembly of these parts require the use of tools and an unduly high degree of skill.

Thus, a clip means which solves the above-mentioned problems is strongly desired.

SUMMARY OF THE INVENTION

Accordingly, an object of the present invention is to provide a clip which readily and firmly secures a heat sink to an electronic device.

Another object of the present invention is to provide a clip which does not need tools in assembly or disassembly, and thus lowers costs.

To achieve the above-mentioned objects, a clip in accordance with the present invention for securing a heat sink to an electronic chip mounted on a socket comprises a substantially V-shaped body, first and second legs depending from respective opposite ends of the body, and a handle formed at the second leg for facilitating manual operation. The body has a horizontal pressing section. Each leg defines a first opening for engagingly receiving a respective projection of the socket. The handle is integrally formed by cutting and bending material from the body and the second leg, and comprises a V-shaped body and an operating section. The operating section of the handle projects out from the second leg. Pressing the handle enables the second leg to be resiliently engaged with the corresponding projection of the socket.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
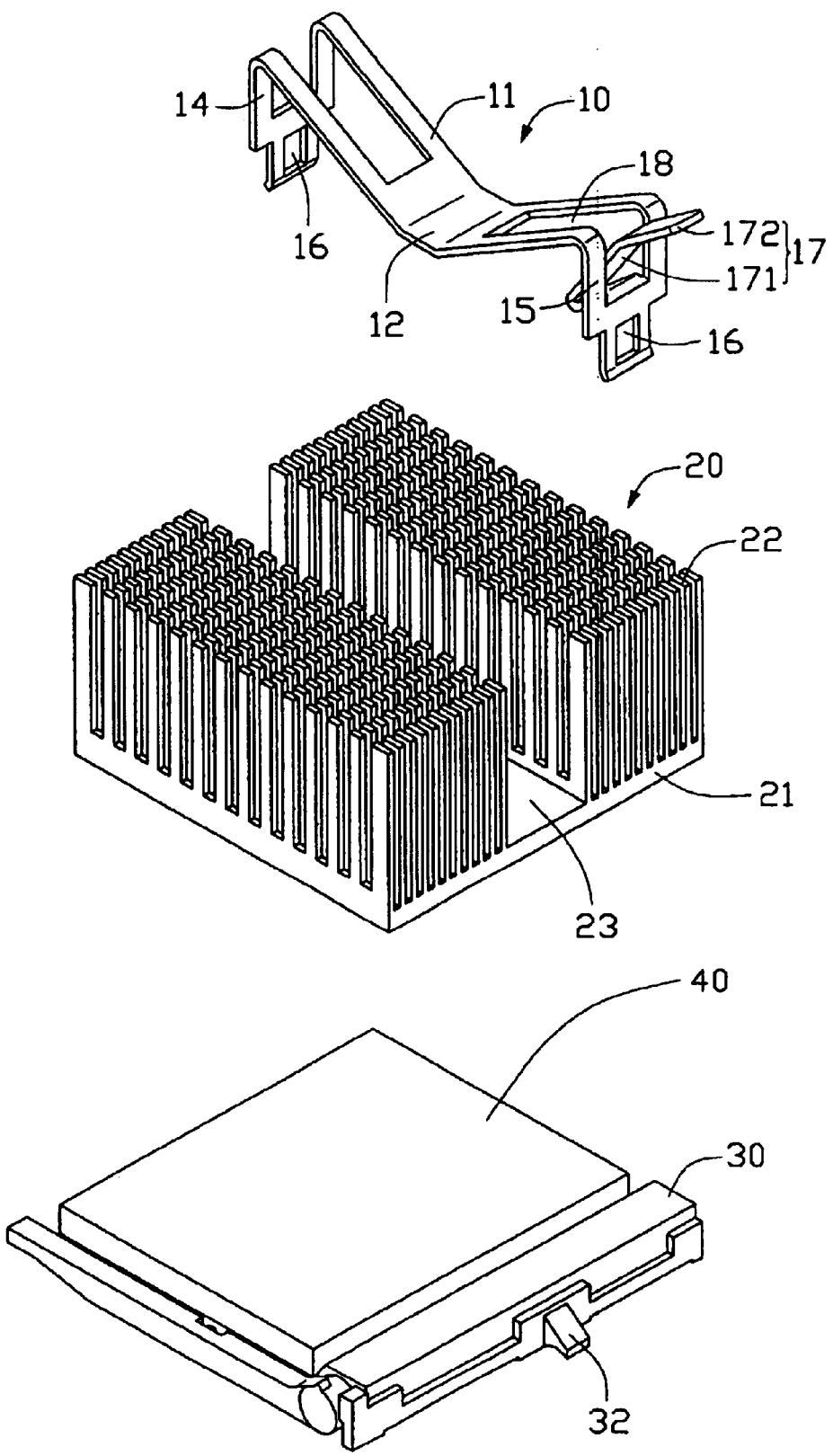
FIG. 1 is an exploded isometric view of a clip of the present invention, together with a heat sink, and an electronic chip mounted on a socket.
Figure 2:
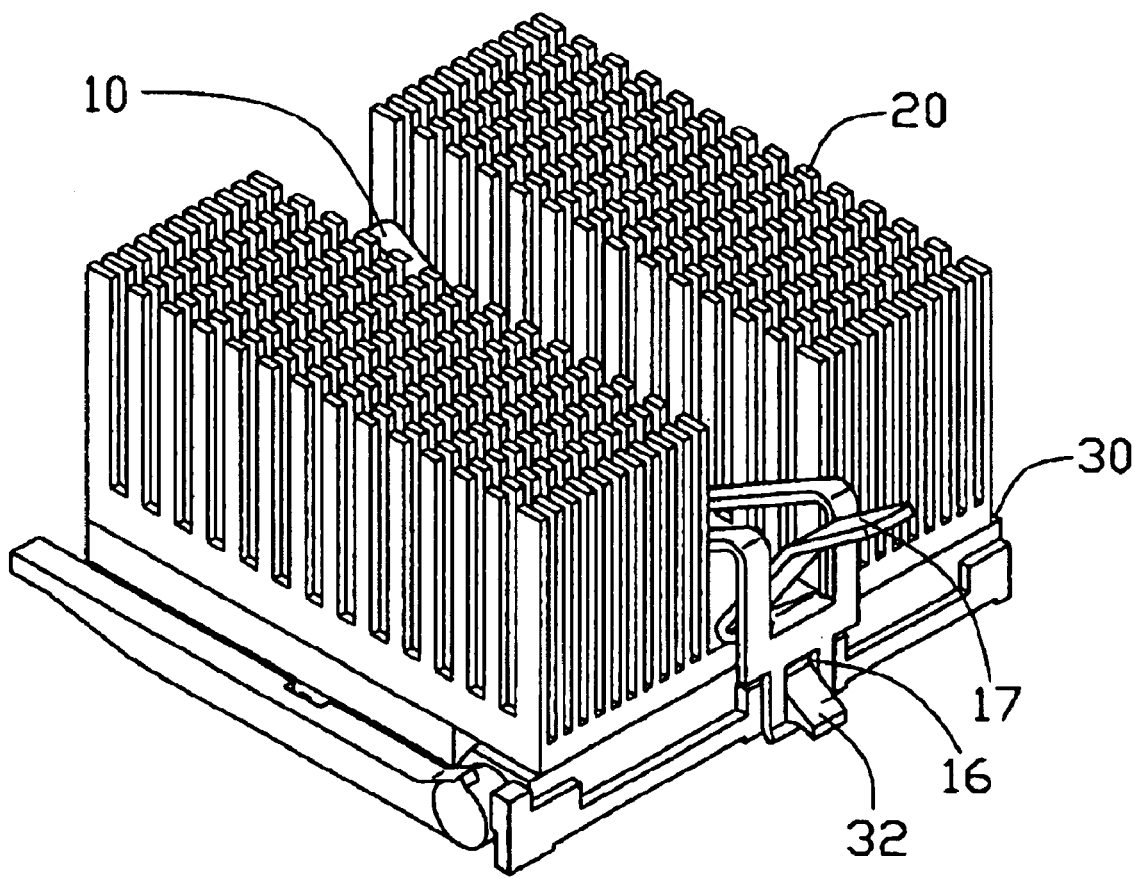
FIG. 2 is an assembled view of FIG. 1.

Referring to FIG. 1, a clip 10 of the present invention is used to attach a heat sink 20 to an electronic chip 40 mounted on a socket 30.

The heat sink 20 comprises a base 21, and a plurality of fins 22 extending upwardly from the base 21. A channel 23 is defined through a center of the fins 22.

The socket 30 has a pair of projections 32 extending from opposite sides thereof respectively. Each projection 32 defines an undercut (not labeled) for enhancing the engagement of the clip 10 therewith.

The clip 10 comprises a substantially V-shaped body 11, first and second legs 14, 15 depending from opposite ends of the body 11 respectively, and a handle 17 formed at the second leg 15 for facilitating manual operation. The body 11 has a central lowermost horizontal pressing section 12. Each leg 14, 15 defines a first opening 16 for engagingly receiving a respective projection 32 of the socket 30. A distal end of each leg 14, 15 is flared, for facilitating engaging of the legs 14, 15 with the projections 32 of the socket 30. The handle 17 is integrally formed by cutting and bending material from the body 11 and an upper part of the second leg 15. A second opening 18 is thus defined in a joint portion of the body 11 and the second leg 15. The handle 17 comprises a V-shaped body 171 and an operating section 172. The V-shaped body 171 is bent inwardly and downwardly from an edge of the second leg 15 that is at an end of the second opening 18, and further folded outwardly and upwardly. The operating section 172 extends from a distal end of the V-shaped body 171, and projects out from the second leg 15 for facilitating operation thereof.

In assembly, the heat sink 20 is placed on the electronic chip 40 mounted on the socket 30. The clip 10 is received in the channel 23 of the heat sink 20, and the pressing section 12 of the clip 10 rests on an upper surface of the base 21 of the heat sink 20. The first opening 16 of the first leg 14 engagingly receives a corresponding one of the projections 32 of the socket 30. Then the operating section 172 of the handle 17 is depressed to cause the second leg 15 to move downwardly until the first opening 16 thereof receives the other projection 32 of the socket 30. The handle 17 is released, and the second leg 15 is resiliently and firmly engaged with said other projection 32. Spring tension of the clip 10 keeps it firmly engaged with the socket 30. The heat sink 20 is thereby securely attached to the electronic chip 40 mounted on the socket 30.

In disassembly, the handle 17 is pressed downwardly and outwardly. The amount of force applied to the operating section 172 of the handle 17 must be sufficient to overcome the spring tension of the clip 10, to cause the second leg 15 at the first opening 16 to disengage from said other projection 32 of the socket 30. Then, the first leg 14 is removed from said one projection 32 of the socket 30. The heat sink 20 is then readily removed from the electronic chip 40 mounted on the socket 30.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted to secure a heat sink to an electronic device mounted on a socket, the clip comprising:

a body having a pressing section;

a first leg depending from an end of the body;

a second leg depending from anther end of the body, an opening being defined in the body at one side of the pressing section and further extending in the second leg; and a handle integrally extending from the second leg at an end of the opening and being resiliently moved in the opening to enable the second leg to resiliently engage with the socket.

2. The clip as described in claim 1, wherein the body is substantially V-shaped, and the pressing section is located at a middle portion of the body.

3. The clip as described in claim 1, wherein a slot is defined in a lower portion of each of the first and second legs.

4. The clip as described in claim 1, wherein a distal end of each of the first and second legs is flared, for facilitating engagement of the first and second legs with the socket.

5. The clip as described in claim 1, wherein the handle comprises a generally V-shaped body which is bent inwardly and downwardly from the second leg at the second opening and further folded outwardly and upwardly, and an operating section extending from a distal end of the V-shaped body.

6. The clip as described in claim 5, wherein the operating section of the handle projects out from the second leg.

7. A heat sink assembly comprising:
   a heat sink comprising a base;
   a socket;
   an electronic device mounted on the socket; and
   a clip comprising a body having a pressing section pressing on the base of the heat sink, a first leg depending from an end of the body, a second leg depending from another end of the body, the first and second legs engaging with the socket, an opening defined in the second leg, a handle integrally formed with the second leg extending inwardly from the opening and successively out of the opening.

8. The heat sink assembly as described in claim 7, wherein the body is substantially V-shaped, and the pressing section is located at a middle portion of the body.

9. The heat sink assembly as described in claim 8, wherein a distal end of each of the first and second legs is flared, for facilitating engagement of the first and second legs with the socket.

10. The heat sink assembly as described in claim 7, wherein the handle comprises a generally V-shaped body which is bent inwardly and downwardly from the second leg in the second opening and further folded outwardly and upwardly, and an operating section extending from a distal end of the V-shaped body.

11. The heat sink assembly as described in claim 10, wherein the operating section of the handle projects out from the second leg.

12. A heat sink assembly comprising:
   an electronic assembly adapted to be mounted on a printed circuit board and having a heat generating electronic device thereof;
   a heat sink seated upon the electronic device; and
   a clip comprising body with a pressing section downwardly abutting against the heat sink, and at least a leg integrally extending downwardly from one end of the body, a lower portion of said leg including means for latching to the electronic assembly, and an upper portion of said leg including a handle directly stamped out of a main plane of said leg, said handle extending first inwardly toward the electronic device and successively outwardly through said opening away from the electronic device; wherein
   an opening is formed in the upper portion of the leg due to the handle being split therefrom.

13. The assembly as described in claim 12, wherein a junction portion of the body joined with said leg, is also stamped out to form a distal operation portion of said handle.

14. The assembly as described in claim 12, wherein said handle extends outwardly with a dimension long enough for manual operation.

* * * * *